US008488792B2

(12) United States Patent
Lagnado et al.

(10) Patent No.: US 8,488,792 B2
(45) Date of Patent: Jul. 16, 2013

(54) WIRELESS COMMUNICATIONS VALIDATION SYSTEM AND METHOD

(75) Inventors: Isaac Lagnado, Houston, TX (US); Timothy Neill, Houston, TX (US); Jeffrey Kevin Jeansonne, Houston, TX (US); Harold S. Merkel, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 2207 days.

(21) Appl. No.: 11/259,705

(22) Filed: Oct. 26, 2005

(65) Prior Publication Data

US 2007/0092080 A1 Apr. 26, 2007

(51) Int. Cl.

| | |
|---|---|
| ***H04K 1/00*** | (2006.01) |
| *G06F 7/04* | (2006.01) |
| *H01Q 3/44* | (2006.01) |
| *G01R 29/10* | (2006.01) |

(52) U.S. Cl.
USPC ............ 380/270; 726/1; 726/2; 726/4; 726/6; 726/26; 726/27; 726/29; 726/34; 713/192; 713/193; 713/194; 343/700 R; 343/703

(58) Field of Classification Search
USPC .................... 380/270; 726/4; 343/700 R, 703
See application file for complete search history.

(56) References Cited

U.S. PATENT DOCUMENTS 5,205,175 A * 4/1993 Garza et al. ..................... 73/628
5,802,074 A * 9/1998 Hall .............................. 714/734
5,991,599 A * 11/1999 Uchikawa ....................... 455/20
6,034,623 A * 3/2000 Wandel .................... 340/870.01
6,072,986 A * 6/2000 Blanchard et al. ........... 455/13.4
6,122,490 A * 9/2000 Hardman ................... 455/67.11
6,359,871 B1 * 3/2002 Chung et al. .................. 370/338
6,469,669 B1 * 10/2002 Tran ............................ 343/702
6,625,428 B1 * 9/2003 Finnell et al. ............. 455/115.1
6,693,513 B2 2/2004 Tuttle
6,853,197 B1 * 2/2005 McFarland et al. ........... 324/549
7,035,609 B1 * 4/2006 Fry ........................... 455/200.1
7,171,238 B2 * 1/2007 Nicholson ..................... 455/557
7,181,225 B1 * 2/2007 Moton et al. ............... 455/456.1
7,199,734 B1 * 4/2007 Yasumasa ..................... 341/101
7,231,177 B2 * 6/2007 Walker et al. ................ 455/3.05
7,580,674 B2 * 8/2009 Gorsuch et al. ................. 455/25
2003/0220126 A1 11/2003 Fuji et al.
2004/0033817 A1 * 2/2004 Gorsuch et al. ............ 455/562.1
2004/0052498 A1 * 3/2004 Colombo et al. ............. 385/147

(Continued)

FOREIGN PATENT DOCUMENTS

| | | |
|---|---|---|
| JP | 9148958 | 6/1997 |
| JP | 2003125441 | 4/2003 |
| JP | 2003304209 | 10/2003 |
| WO | WO 99/66409 | 12/1999 |

OTHER PUBLICATIONS

EP Office Action, dated Feb. 24, 2010, 3 pages.
JP Official Action dated Sep. 15, 2009, pp. 3.

(Continued)

*Primary Examiner* — Edan Orgad
*Assistant Examiner* — Jenise E Jackson

(57) ABSTRACT

A wireless communications validation system comprises a validation module configured to determine an identity of an antenna disposed in a computer system and an identity of a wireless module disposed in the computer system, the validation module configured to validate permissible combination of the antenna with the wireless module.

26 Claims, 2 Drawing Sheets

U.S. PATENT DOCUMENTS

| | | | | |
|---|---|---|---|---|
| 2004/0137912 | A1 | 7/2004 | Lin | |
| 2004/0203347 | A1 | 10/2004 | Nguyen | |
| 2004/0203913 | A1 * | 10/2004 | Ogino et al. | 455/456.1 |
| 2004/0214532 | A1 * | 10/2004 | Azuma | 455/101 |
| 2004/0228297 | A1 * | 11/2004 | Elzind | 370/328 |
| 2005/0048997 | A1 * | 3/2005 | Grobler et al. | 455/550.1 |
| 2005/0049020 | A1 | 3/2005 | Higgins et al. | |
| 2005/0059359 | A1 * | 3/2005 | Dornbusch | 455/78 |
| 2005/0074123 | A1 * | 4/2005 | Cromer et al. | 380/270 |
| 2005/0075133 | A1 | 4/2005 | Pinder et al. | |
| 2005/0075136 | A1 | 4/2005 | Cromer et al. | |
| 2005/0094591 | A1 * | 5/2005 | Kwon | 370/321 |
| 2005/0143058 | A1 * | 6/2005 | Chang et al. | 455/418 |
| 2005/0147070 | A1 | 7/2005 | Cromer et al. | |
| 2005/0153665 | A1 * | 7/2005 | Nicholson | 455/83 |
| 2005/0181643 | A1 * | 8/2005 | Brower et al. | 439/76.1 |
| 2005/0193305 | A1 * | 9/2005 | Belotserkovsky et al. | 714/746 |
| 2006/0026650 | A1 * | 2/2006 | Kim et al. | 725/62 |
| 2006/0094466 | A1 * | 5/2006 | Tran | 455/558 |
| 2006/0187890 | A1 * | 8/2006 | Lin | 370/338 |
| 2009/0027282 | A1 * | 1/2009 | Finn et al. | 343/703 |
| 2009/0115662 | A1 * | 5/2009 | Edwards | 342/413 |

OTHER PUBLICATIONS

EP Official Action dated Oct. 6, 2009, pp. 5.

European Patent Office, Communication pursuant to Article 94(3) EPC, Application No. 06020471.6, date of mailing Dec. 6, 2010, pp. 5.

European Patent Office, Communication pursuant to Article 94(3) EPC, Appln No. 06020471.6, date of mailing Jul. 14, 2011, 6 p.

European Patent Office, Summons to attend oral proceedings pursuant to Rule 115(1) EPC, Application No. 06020471.6, date of mailing Dec. 20, 2011, 7 p.

* cited by examiner

WIRELESS COMMUNICATIONS VALIDATION SYSTEM AND METHOD

BACKGROUND OF THE INVENTION

An increasing number of computer systems are being configured or are configurable for wireless communications. For example, such computer systems generally comprise a radio or wireless module and an antenna for transmitting and receiving radio frequency (RF) signals. The RF spectrum used by such wireless communication systems is strictly regulated (e.g., by the Federal Communication Commission) at least because of unknown health concerns associated with particular untested RF frequencies and/or because different RF bandwidths are reserved for different services or applications (e.g., military, aviation and commercial broadcasts). However, because of the wireless configurability of such computer systems, a consumer-configured, or even manufacturer-configured, computer system having wireless communication capabilities may violate the RF spectrum regulations, especially when the antenna is not an integral part of the wireless module.

BRIEF DESCRIPTION OF THE DRAWINGS

For a more complete understanding of the present invention and the advantages thereof, reference is now made to the following descriptions taken in connection with the accompanying drawings in which.

DETAILED DESCRIPTION OF THE DRAWINGS

The preferred embodiments of the present invention and the advantages thereof are best understood by referring to FIGS. 1-4 of the drawings, like numerals being used for like and corresponding parts of the various drawings.

Figure 1:
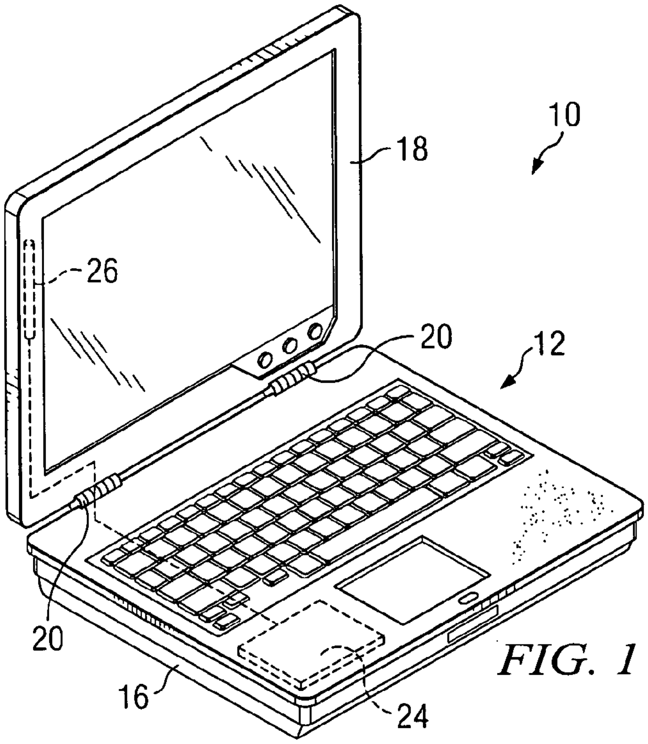
FIG. 1 is a diagram illustrating a computer system in which an embodiment of a wireless communications validation system in accordance with the present invention is used to advantage.

FIG. 1 is a diagram illustrating a computer system 12 in which an embodiment of a wireless communications validation system 10 in accordance with the present invention is used to advantage. Computer system 12 may comprise any type of computer device such as, but not limited to, a portable laptop or notebook computer, tablet computer, personal digital assistant, desktop computer, computer docking station, or any other type of portable or non-portable computer or computer-related device. In the embodiment illustrated in FIG. 1, computer system 12 comprises a base member 16 rotatably coupled to a display member 18 by hinge assemblies 20. In the embodiment illustrated in FIG. 1, computer system 12 is configured for wireless communications having a radio or wireless module 24 disposed in base member 16. The wireless module 24 is communicatively coupled to an antenna 26 disposed in display member 18. In the embodiment illustrated in FIG. 1, computer system 12 is illustrated as having only a single wireless module 24 and single antenna 26. However, it should be understood that computer system 12 may be configured with additional wireless modules and/or antennas (e.g., separate wireless module/antenna combinations and/or a single wireless module coupled to a plurality of antennas). Further, it should be understood that wireless module 24 and/or antenna 26 may be otherwise located in computer system 12 (e.g., both solely in display member 18, both solely in base member 16, or reversed (e.g., antenna 26 in base member 16 and wireless module 24 in display member 18)).

Figure 2:
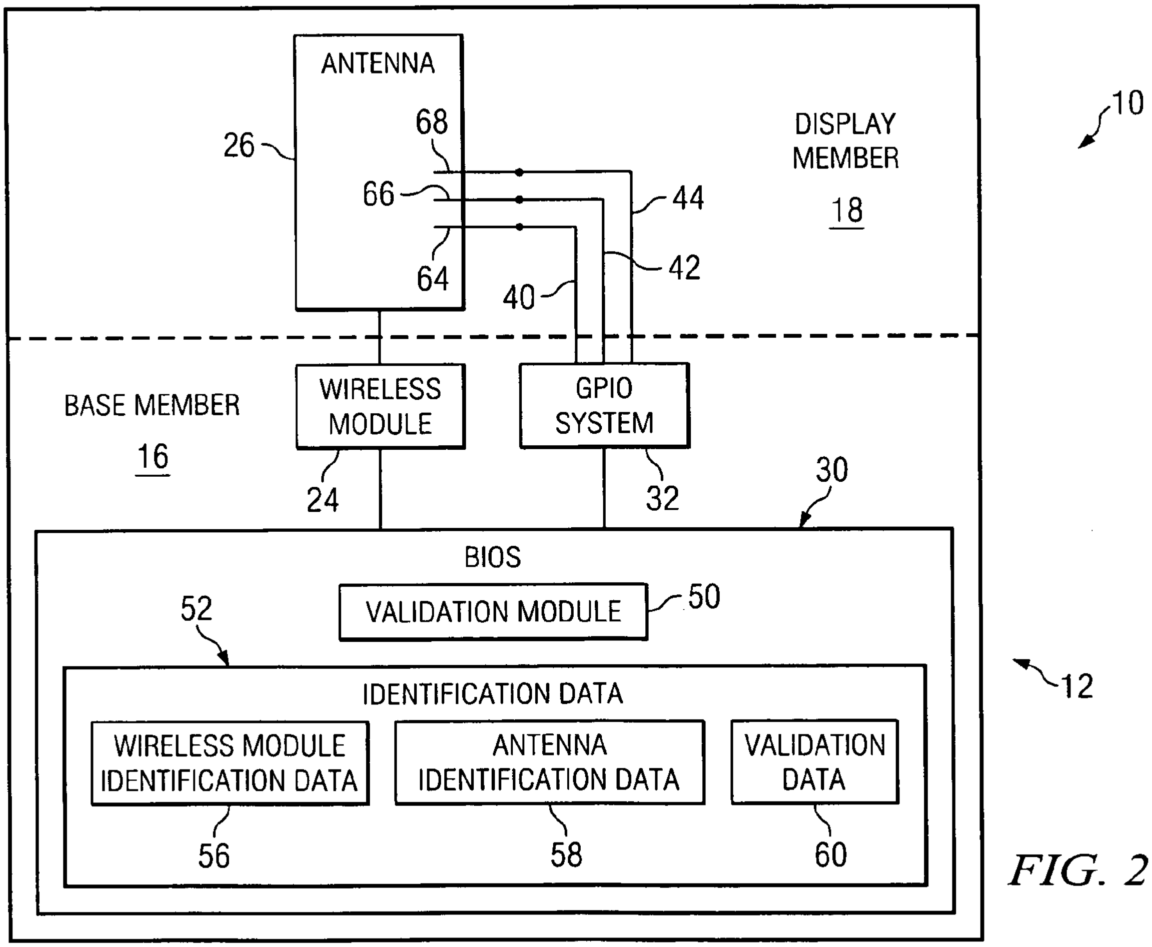
FIG. 2 is a block diagram illustrating an embodiment of a wireless communications validation system in accordance with the present invention.

FIG. 2 is a block diagram illustrating an embodiment of wireless communications validation system 10 in accordance with the present invention. Embodiments of the present invention are configured to validate and/or authorize use of a particular antenna 26 with a particular wireless module 24 as a permissible wireless communications combination (e.g., to comply with radio frequency (RF) spectrum regulations controlled and/or regulated by the Federal Communications Commission (FCC) or other regulatory agencies). In the embodiment illustrated in FIG. 2, system 10 comprises a basic input/output system (BIOS) 30 communicatively coupled to wireless module 24 and a general purpose input/output (GPIO) system 32. In the embodiment illustrated in FIG. 2, GPIO system 32 comprises an input bus of three GPIO signals 40, 42 and 44 to antenna 26. However, it should be understood that a greater or lesser quantity of GPIO signals may be used. Further, in FIG. 2, a single antenna 26 is illustrated as being coupled to GPIO system 32. However, it should be understood that additional antennas may be also be coupled to GPIO system 32.

In the embodiment illustrated in FIG. 2, BIOS 30 comprises a validation module 50 and identification data 52. Validation module 50 may comprise hardware, software, or a combination of hardware and software. In FIG. 2, validation module 50 is illustrated as being disposed in BIOS 30 to control and/or otherwise limit access thereto by a user of computer system 12. However, it should be understood that validation module 50 may be otherwise located.

Identification data 52 comprises information associated with an identity of wireless module 24 and an identity of antenna 26. For example, in the embodiment illustrated in FIG. 2, identification data 52 comprises wireless module identification data 56 and antenna identification data 58. Wireless module identification data 56 comprises information associated with identifying a particular type, model, manufacturer, operating parameter(s) or other identifying characteristics associated with wireless module 24. Antenna identification data 58 comprises information associated with a type, model, manufacturer, operating parameter(s) or other identifying characteristics associated with antenna 26. In the embodiment illustrated in FIG. 2, identification data 52 also comprises validation data 60 having information associated with verifying and/or otherwise validating a particular combination of antenna and wireless module (e.g., verify permissible use of a particular antenna with a particular wireless module). For example, in some embodiments of the present invention, validation data 60 comprises relational information identifying permissible antenna/wireless module combinations in accordance with FCC requirements and/or other regulations.

In operation, BIOS 30 interfaces with wireless module 24 to obtain and/or otherwise acquire information as to an identity of wireless module 24. For example, in some embodiments of the present invention, BIOS 30 performs an enumeration operation to identify wireless module 24. In response to obtaining identification information associated with wireless module 24, BIOS 30 and/or validation module 50 stores the identification information associated with wireless module 24 as wireless module identification data 56.

GPIO system 32 interfaces with antenna 26 and BIOS 30 to obtain and/or otherwise provide identification information of antenna 26. For example, in the embodiment illustrated in FIG. 2, GPIO system 32 is coupled to three connector elements 64, 66 and 68 of antenna 26 for receiving GPIO signals 40, 42 and 44 therefrom. It should be understood that antenna 26 may be configured with additional connector elements (e.g., for connecting to wireless module 24, power, ground, etc.). In operation, GPIO system 32 receives input from antenna 26 of GPIO input signals 40, 42 and 44 indicative of an identity of antenna 26. For example, in some embodiments of the present invention, antenna 26 is configured to drive GPIO input signals 40, 42 and 44 as HI or LO. In the embodiment illustrated in FIG. 2, three GPIO input signals 40, 42 and 44 are used and thereby provide eight different signal combinations. Thus, preferably, different antennas are configured to drive different signal combinations as GPIO input signals 40, 42 and 44 such that the driven signal combination uniquely identifies the antenna. Thus, in operation, GPIO system 32 interfaces with validation module 50 to identify the received signal combination, thereby enabling identification of antenna 26. In response to receiving an indication of the signal combination driven by antenna 26 from GPIO system 32, validation module 50 identifies antenna 26 and stores information associated with the identified antenna 26 as antenna identification data 58. It should be understood that a different quantity of GPIO input signals may be used (e.g., a greater number of GPIO input signals to provide for a greater number of signal combinations).

In operation, validation module 50 uses validation data 60 to verify and/or otherwise validate permissible use of the identified antenna 26 with the identified wireless module 24. For example, as described above, validation data 60 comprises relational information identifying permissible combinations of antennas and wireless modules. Thus, wireless module identification data 56 and antenna identification data 58 are compared with the relational validation data 60 to verify and/or authenticate permissible use of the particular identified antenna 26 with the particular identified wireless module 24. In some embodiments of the present invention, if validation module 50 determines that the identified antenna 26 and the identified wireless module 24 is an impermissible wireless combination (e.g., in violation of FCC regulations), BIOS 30 is configured to disable wireless communications of computer system 12. BIOS 30 may be configured to disable wireless communications of computer system 12 using a variety of methods such as, but not limited to, initiating and/or otherwise transmitting a disable signal to wireless module 24, preventing operation of wireless module 24, or preventing control of wireless module 24 by an operating system of computer system 12 (e.g., not handing control over wireless module 24 to the operating system). In yet other embodiments of the present invention, if validation module 50 is unable to identify a particular antenna and/or wireless module (e.g., unknown GPIO signal combination, unable to access or communicate with the antenna or wireless module, etc.), BIOS 30 is configured to disable wireless communications of computer system 12. In the embodiment illustrated in FIG. 2, a single antenna 26 is evaluated for use with a single wireless module 24. However, it should be understood that embodiments of the present invention contemplate validation of each antenna/wireless module combination of computer system 12 (e.g., for a single wireless module configured to wirelessly communicate via two different antennas, validating permissible use of each of the antennas with the wireless module).

Figure 3:
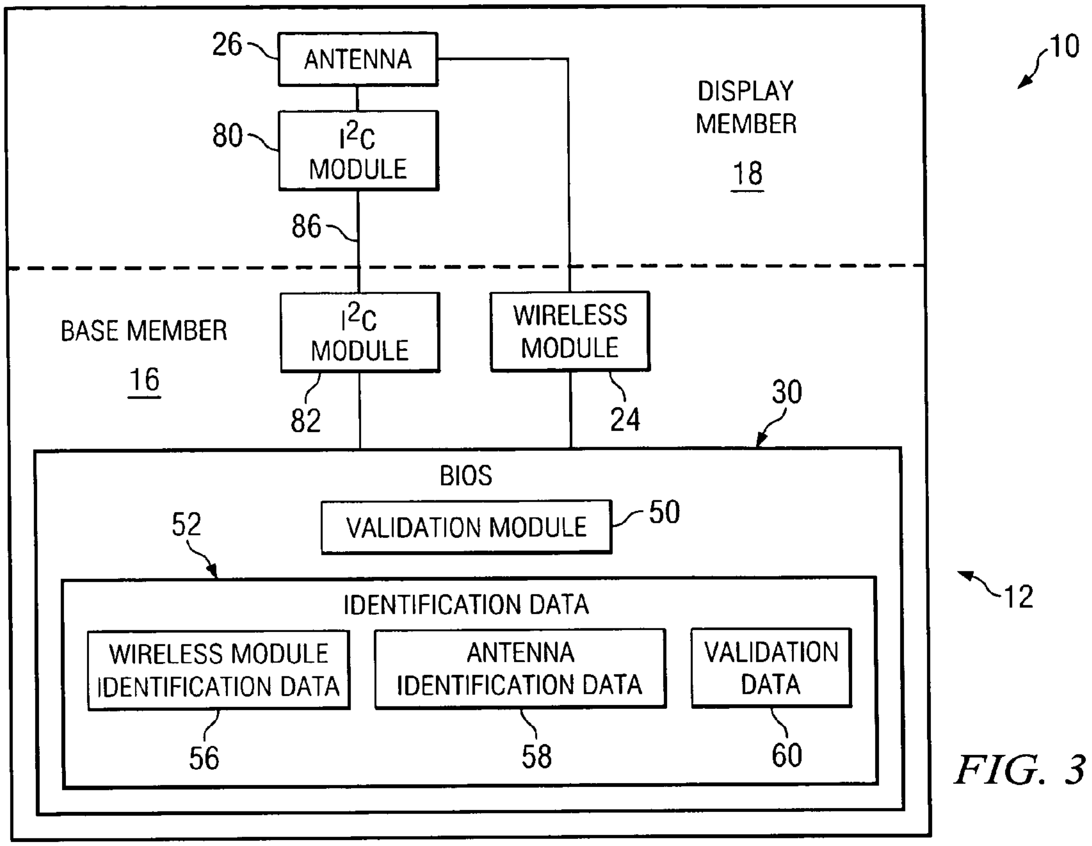
FIG. 3 is a block diagram illustrating another embodiment of a wireless communications validation system in accordance with the present invention.

FIG. 3 is a block diagram illustrating another embodiment of system 10 in accordance with the present invention. In the embodiment illustrated in FIG. 3, system 10 comprises inter-integrated circuit ($I^2C$) modules 80 and 82 communicatively coupled to each other by an $I^2C$ bus 86. In the embodiment illustrated in FIG. 3, $I^2C$ module 80 is communicatively coupled to antenna 26, and $I^2C$ module 82 is communicatively coupled to BIOS 30. In the embodiment illustrated in FIG. 3, two $I^2C$ modules are illustrated (e.g., module 80 disposed in display member 18 and module 82 disposed in base member 16). However, it should be understood that a greater quantity of $I^2C$ modules may be used.

In operation, $I^2C$ module 80 applies a current to antenna 26 and measures a voltage response signal associated with antenna 26. $I^2C$ module 80 communicates the voltage response signal associated with antenna 26 over $I^2C$ bus 86 to $I^2C$ module 82. $I^2C$ module 82 interfaces with BIOS 30 to provide information associated with the voltage response signal to validation module 50. Based on the voltage response signal associated with antenna 26, validation module 50 identifies antenna 26. For example, in some embodiments of the present invention, different types, models, etc., of antennas have different voltage response characteristics in response to a particular and/or predetermined current being applied thereto such that, based on the voltage response signal, an identification of the particular antenna is obtained. Thus, in response to obtaining and/or otherwise acquiring voltage response signal information associated with antenna 26, validation module 50 determines an identity of antenna 26 and stores information associated with the identity of antenna 26 as antenna identification data 58. As described above, BIOS 30 performs an enumeration operation to interface with wireless module 24 to identify wireless module 24, and stores identification information associated with the wireless module 24 as wireless module identification data 56.

Thus, in operation, in response to identifying both antenna 26 and wireless module 24, validation module 50 compares wireless module identification data 56 associated with wireless module 24 and antenna identification data 58 associated with antenna 26 with validation data 60 to verify and/or otherwise validate permissible use of the identified antenna 26 with the identified wireless module 24. In some embodiments of the present invention, in response to determining that the identification of antenna 26 and wireless module 24 indicates an impermissible combination, BIOS 30 is configured to disable wireless communications of computer system 12. Further, in some embodiments of the present invention, if validation module 50 is unable to identify the particular antenna and/or wireless module (e.g., unknown voltage response signal, unable to access and/or communicate with the antenna or the wireless module, etc.), BIOS 30 is configured to disable wireless communications of computer system 12.

Figure 4:
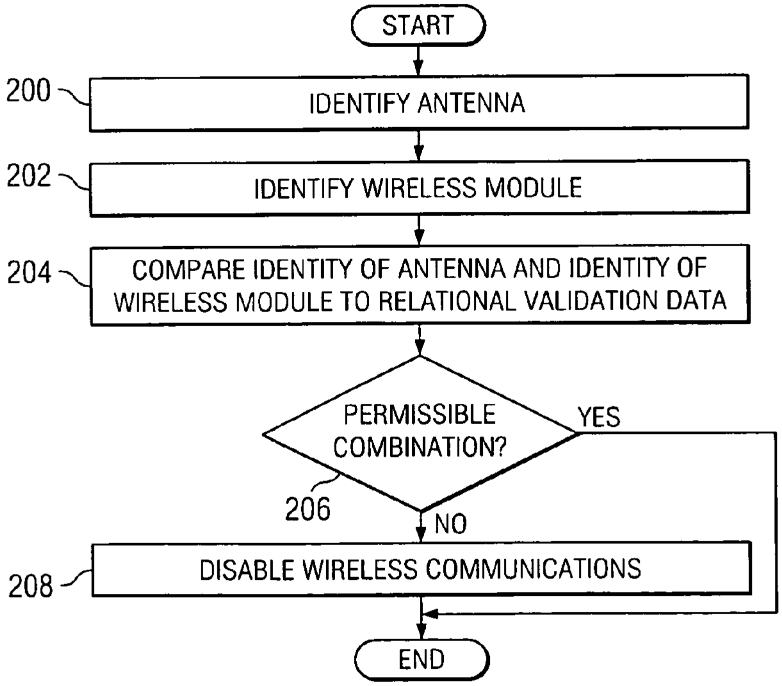
FIG. 4 is a flow diagram illustrating an embodiment of a wireless communications validation method in accordance with the present invention.

FIG. 4 is a flow diagram illustrating an embodiment of a wireless communications validation method in accordance with the present invention. The method begins at block 200, where an identity of antenna 26 is determined. At block 202, an identity of wireless module 24 is determined. At block 204, validation module 50 compares identification information associated with antenna 26 and identification information associated with wireless module 24 with validation data 60. At decisional block 206, a determination is made whether the combination of antenna 26 and wireless module 24 is permissible. If the combination of antenna 26 and wireless module 24 is permissible, the method ends. If the combination of antenna 26 and wireless module 24 is impermissible, the method proceeds to block 208, where BIOS 30 disables wireless communications for computer system 12.

Thus, embodiments of the present invention validate the use of a particular antenna with a particular wireless module. For example, because of the configurability of computer systems, a user of the computer system may modify, upgrade and/or otherwise configure and/or re-configure the computer system to incorporate wireless functionality, provide additional wireless functionality and/or modify a particular wireless configuration (e.g., adding an antenna, adding a wireless module, adding both an antenna and a wireless module, changing the wireless module while retaining a particular antenna, etc.). Embodiments of the present invention automatically identify the particular antenna(s) and the particular wireless module(s) in the computer system 12 and automatically validate the use of the particular antenna(s) with the particular wireless module(s). It should be understood that in the described method, certain functionality may be omitted, accomplished in a sequence different from that depicted in FIG. 4, or performed simultaneously or in combination. Also, it should be understood that the method depicted in FIG. 4 may be altered to encompass any of the other features or aspects of the invention as described elsewhere in the specification.

What is claimed is:

1. A wireless communications validation system, comprising: a validation module disposed in a basic input/output system (BIOS) that is configured to determine an identity of an antenna disposed in a computer system and an identity of a wireless module disposed in the computer system, the validation module configured to validate permissible combination of the antenna with the wireless module; and an inter-integrated circuit ($I^2C$) module configured to interface with the validation module for determining the identity of the antenna, wherein the input identifies a type, model or manufacturer of the antenna.

2. The system of claim 1, wherein the validation module is configured to disable wireless communications of the computer system in response to determining an impermissible combination of the antenna with the wireless module.

3. The system of claim 1, wherein the computer system comprises a portable computer system.

4. A wireless communications validation method, comprising:

determining an identity of an antenna of a computer system;

determining an identity of a wireless module of the computer system; validating, by a validation module, permissible combination of the antenna with the wireless module; disposing the validation module in a basic input/output system (BIOS) of the computer system: determining the identity of the antenna using an inter-integrated circuit $I^2C$ module configured to interface with the validation module.

5. The method of claim 4, further comprising disabling wireless communications of the computer system in response to determining an impermissible combination of the antenna with the wireless module.

6. The method of claim 4, further comprising disposing the validation module in a portable computer.

7. A wireless communications validation system, comprising:

means for determining an identity of an antenna of a computer system;

means for determining an identity of a wireless module of the computer system; means for automatically validating permissible combination of the antenna with the wireless module; wherein the validation module is disposed in a basic input/output system (BIOS); and means for determining the identity of the antenna based upon signals from the antenna in response to the applied direct current, the means for determining the identity of the antenna comprising an inter-integrated circuit $I^2C$ module configured to interface with the BIOS.

8. The system of claim 7, further comprising means for disabling wireless communications of the computer system in response to determining an impermissible combination of the antenna with the wireless module.

9. A wireless communications validation system, comprising:

a basic input/output system (BIOS) configured to determine whether a particular antenna of a computer system used with a particular wireless module of the computer system is a permissible combination for wireless communications; and an inter-integrated circuit ($I^2C$) module configured to interface with the BIOS module for determining an identity of the antenna, wherein the input identifies a type, model or manufacturer of the antenna.

10. The system of claim 9, wherein the BIOS is configured to disable wireless communications of the computer system in response to determining that the use of the particular antenna with the particular wireless module is an impermissible combination.

11. The system of claim 9, wherein the BIOS is disposed in a portable computer system.

12. A wireless communications validation system, comprising:

a validation module configured to determine an identity of an antenna disposed in a computer system and an identity of a wireless module disposed in the computer system, the validation module configured to validate permissible combination of the antenna with the wireless module; and an inter-integrated circuit ($I^2C$) module configured to interface with the validation module for determining the identity of the antenna.

13. The system of claim 12, wherein the validation module is disposed in a basic input/output system (BIOS).

14. The system of claim 12, wherein the validation module is configured to disable wireless communications of the computer system in response to determining an impermissible combination of the antenna with the wireless module.

15. The system of claim 12, wherein the computer system comprises a portable computer system.

16. The system of claim 1, wherein the input from the antenna identifies the manufacturer of the antenna.

17. The method of claim 4, wherein determining the identity of antenna comprises determining the manufacturer of the antenna.

18. The system of claim 7, wherein the identity of the antenna identifies the manufacturer of the antenna.

19. The system of claim 9, wherein the input from the antenna identifies the manufacturer of the antenna.

20. The system of claim 1, wherein the input from the antenna identifies the model of the antenna.

21. The method of claim 4, wherein determining the identity of antenna comprises determining the model of the antenna.

22. The system of claim 7, wherein the identity of the antenna identifies the model of the antenna.

23. The system of claim 9, wherein the input from the antenna identifies the model of the antenna.

24. The system of claim 12, wherein the identity of the antenna identifies a type, model or manufacturer of the antenna.

25. The system of claim 12, wherein the identity of the antenna identifies a model or manufacturer of the antenna.

26. A wireless communications validation system, comprising:

a validation module disposed in a basic input/output system (BIOS) that is configured to determine an identity of an antenna disposed in a computer system and an identity of a wireless module disposed in the computer system, the validation module configured to validate permissible combination of the antenna with the wireless module; and an inter-integrated circuit $I^2C$ module configured to interface with the BIOS module for determining the identity of the antenna, wherein the input identifies a model of the antenna.

* * * * *

UNITED STATES PATENT AND TRADEMARK OFFICE

CERTIFICATE OF CORRECTION

PATENT NO. : 8,488,792 B2
APPLICATION NO. : 11/259705
DATED : July 16, 2013
INVENTOR(S) : Isaac Lagnado et al.

It is certified that error appears in the above-identified patent and that said Letters Patent is hereby corrected as shown below:

In the Claims

In column 5, line 51, in Claim 4, delete "system:" and insert -- system; --, therefor.

Signed and Sealed this
Twelfth Day of November, 2013

Teresa Stanek Rea
*Deputy Director of the United States Patent and Trademark Office*